(12) United States Patent
Hieda et al.

(10) Patent No.: US 6,398,900 B1
(45) Date of Patent: Jun. 4, 2002

(54) METHOD OF STICKING TRANSPARENT ELECTROMAGNETIC WAVE SHIELD FILM

(75) Inventors: Yoshihiro Hieda; Kazuaki Sasa; Kazuhiko Miyauchi; Toshitaka Nakamura, all of Osaka (JP)

(73) Assignee: Nitto Denko Corporation, Ibaraki (JP)

( * ) Notice: Subject to any disclaimer, the term of this patent is extended or adjusted under 35 U.S.C. 154(b) by 42 days.

(21) Appl. No.: 09/608,006

(22) Filed: Jun. 30, 2000

(30) Foreign Application Priority Data

Jul. 16, 1999 (JP) .......................................... 11-202492

(51) Int. Cl.[7] .............................................. B32B 31/04
(52) U.S. Cl. ........................ 156/245; 156/299; 156/539
(58) Field of Search ................................ 313/112, 292, 313/313; 359/359, 580; 349/58, 59; 248/686, 346.05, 918, 682, 346.01, 346.03, 903, 908; 156/245, 226, 536, 539, 580, 581, 297, 299, 300, 556; 269/37, 40, 44, 45, 289 R, 311, 900, 903, 909; 100/210, 915

(56) References Cited

U.S. PATENT DOCUMENTS

| | | | | |
|---|---|---|---|---|
| 6,104,530 A | * | 8/2000 | Okamura et al. | 359/359 |
| 6,188,174 B1 | * | 2/2001 | Marutsuka | 313/479 |
| 6,316,110 B1 | * | 11/2001 | Anzaki et al. | 428/432 |

FOREIGN PATENT DOCUMENTS

| | | |
|---|---|---|
| EP | 0 834 898 A2 | 4/1998 |
| EP | 0 886 295 A2 | 12/1998 |
| EP | 0 908 920 A2 | 4/1999 |

* cited by examiner

*Primary Examiner*—Michael W. Ball
*Assistant Examiner*—Gladys Piazza
(74) *Attorney, Agent, or Firm*—McGinn & Gibb, PLLC

(57) ABSTRACT

A method of sticking a transparent electromagnetic wave shield film onto a front surface of a plasma display panel is disclosed. The plasma display panel has a level difference in a thickness direction thereof. The plasma display panel is mounted on an attachment adapted to an outer shape of the plasma display. The level difference is eliminated apparently, and the transparent electromagnetic wave shield film is stuck onto the front surface of the plasma display panel.

2 Claims, 4 Drawing Sheets

METHOD OF STICKING TRANSPARENT ELECTROMAGNETIC WAVE SHIELD FILM

BACKGROUND OF THE INVENTION

1. Field of the Invention

The present invention relates to a method of sticking a transparent electromagnetic wave shield film directly onto a front surface of a plasma display panel (hereinafter referred to as PDP) for displaying a television picture, or the like, and particularly relates to a method by which a PDP is prevented from being damaged when such a shield film is stuck onto the PDP.

The present application is based on Japanese Patent Application No. Hei. 11-202492, which is incorporated herein by reference.

2. Description of the Related Art

To shield electromagnetic waves and near-infrared rays generated from a PDP, an electromagnetic wave shield filter has been heretofore disposed apart from a front surface of the PDP. The filter is made from a transparent substrate such as a glass plate, an acrylic plate, or the like, which is coated with a sputtering layer of Ag, or the like, a near-infrared absorbing layer, etc. as an electromagnetic wave shielding function so as to have a low anti-reflection function both in the frontmost surface on the view angle side and in the rearmost surface. There are, however, a problem that double reflection of external light occurs because an air layer is produced when such a filter is disposed apart from the panel, and a problem that the PDP is thickened or heavy-weighted because a transparent substrate is used.

To solve the aforementioned problems, there is conceived a method of sticking a roll of electromagnetic wave shield film directly onto a front surface of the PDP, or the like. In the direct sticking method, the problem in double reflection of external light can be avoided because there is no air layer produced as in the background art. Further, in the direct sticking method, the problem in increase of the thickness, weight, etc. of the PDP in the background art can be avoided because the aforementioned electromagnetic wave shield film can be provided as a thin and light-weight film.

The PDP, however, has a double glass substrate structure with a front substrate and a rear substrate each about 3 mm thick. The PDP has bus electrodes at long-side opposite ends of the front substrate, and address electrodes at short-side opposite ends of the rear substrate. The PDP is shaped so that level differences in a direction of thickness of the PDP between the two substrates, that is, level differences each equal to the thickness of each substrate, are disposed in the two kinds of electrode portions. Further, the PDP is provided with gas filled tubes, or the like, so that protrusive portions are formed on the rear surface side. Hence, there was a problem that the PDP was damaged because stress was concentrated into the level difference portions and the protrusive portions when a roll of electromagnetic wave shield film was stuck directly onto the PDP, or the like.

SUMMARY OF THE INVENTION

An object of the present invention in consideration of the aforementioned problem is to prevent stress concentration into level difference portions and protrusive portions of a PDP to thereby prevent the PDP from being damaged when an electromagnetic wave shield film is stuck directly onto a front surface of the PDP.

As a result of eager examination of the inventors of this application to achieve the foregoing object, the inventors obtained the following finding. That is, an electromagnetic wave shield film could be stuck onto a front surface of a PDP well without any damage of the PDP because stress was prevented from being concentrated into level difference portions and protrusive portions as described above if the shield film was stuck directly onto the front surface of the PDP after the PDP was mounted on an attachment adapted to the shape of the PDP so that the level difference and protrusive portions of the PDP were eliminated apparently. This finding was concluded by the accomplishment of the present invention.

That is, the present invention relates to a method of sticking a transparent electromagnetic wave shield film onto a front surface of a plasma display panel having a level difference in a direction of a thickness thereof, comprising steps of:

mounting the plasma display panel on an attachment adapted to an outer shape of the plasma display; and sticking the film onto the front surface of the panel.

The present invention particularly relates to a method of sticking a transparent electromagnetic wave shield film onto a front surface of a plasma display panel, wherein the plasma display panel has a front substrate and a rear substrate laminated with each other, level differences being provided in a direction of thickness of the plasma display panel between the front substrate and the rear substrate, the level differences existing at four sides of the plasma display panel, and a protrusive portion being provided on a rear surface side of the rear substrate, the method comprising steps of:

preparing an attachment having two pairs of side portions and a bottom portion, each side portion having a shape adapted to the side of the plasma display panel having the level difference, and the bottom portion having a hole to which the protrusive portions are to be fitted;

mounting the plasma display panel on the attachment so that the protrusive portion is fitted into the hole of the bottom portion, the front substrate and side portions of the attachment are arranged approximately in one plane, and four sides of the plasma display panel each having the level difference face the side portions of the attachment without any gap; and sticking the transparent electromagnetic wave shield film onto the front surface of the plasma display panel.

Features and advantages of the invention will be evident from the following detailed description of the preferred embodiments described in conjunction with the attached drawings.

DETAILED DESCRIPTION OF THE PREFERRED EMBODIMENTS

An embodiment of the present invention will be described below with reference to the drawings.

Figure 1:
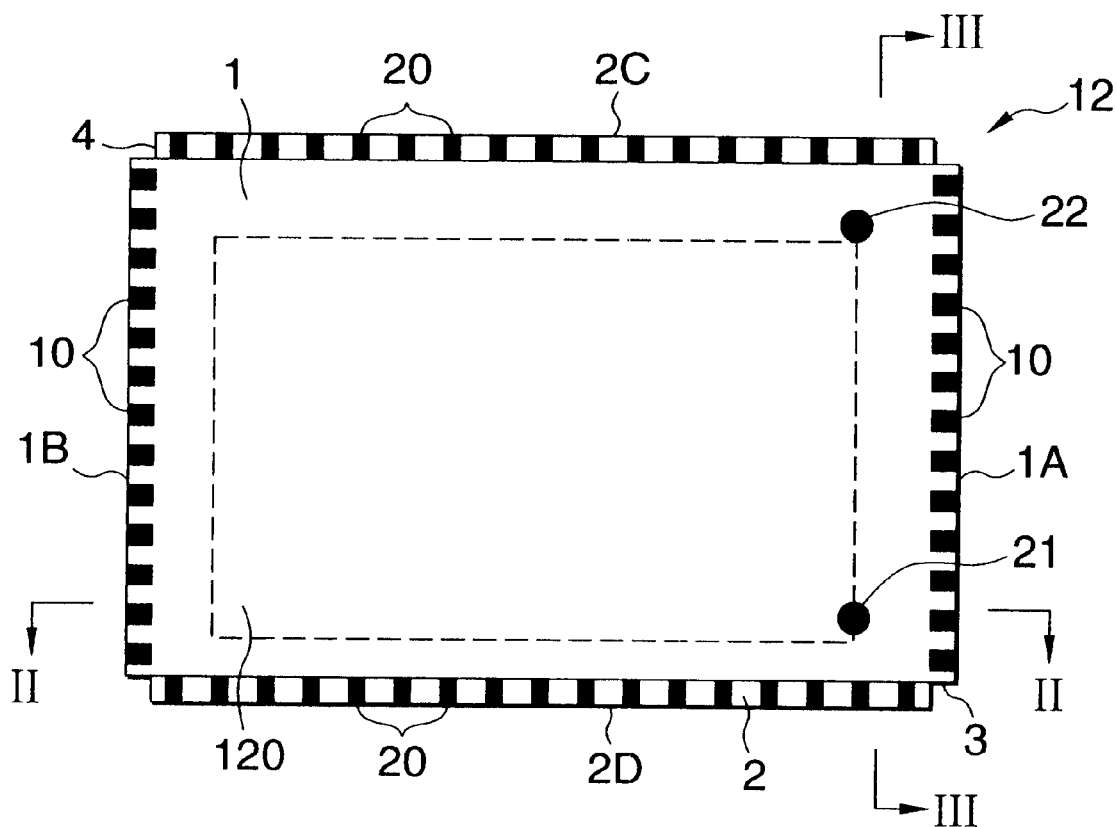
FIG. 1 shows a front view showing an example of a panel structure of a plasma display panel.
Figure 2:
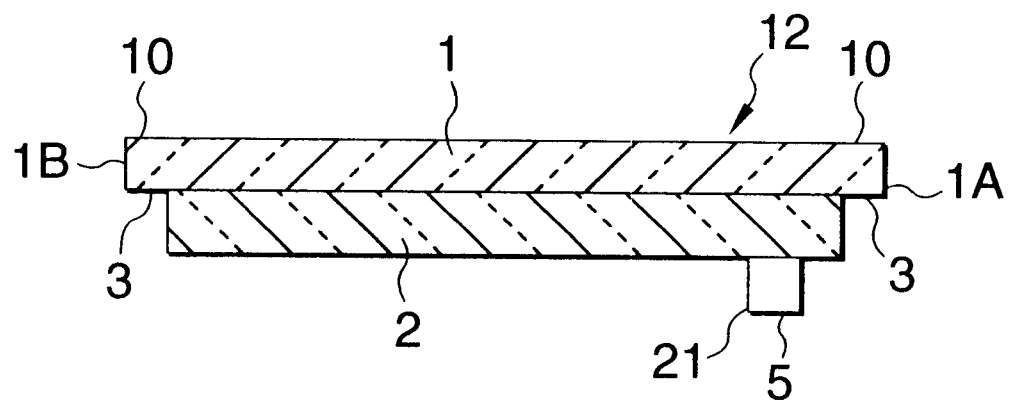
FIG. 2 shows a sectional view taken along the line II—II in FIG. 1.
Figure 3:
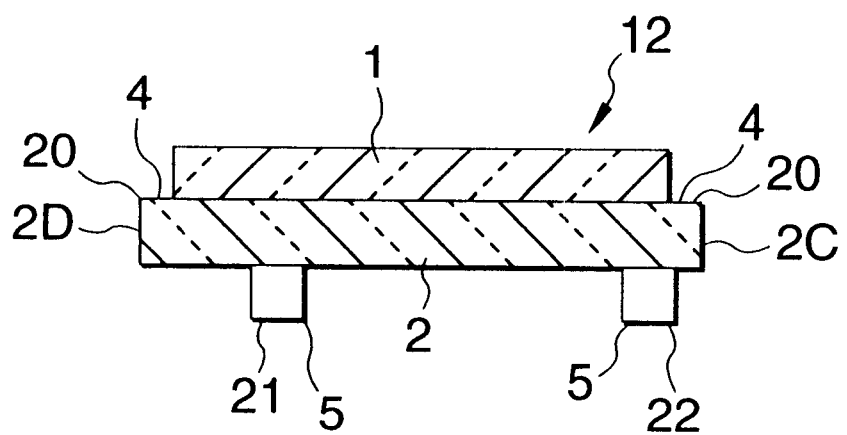
FIG. 3 shows a sectional view taken along the line III—III in FIG. 1.

FIGS. 1 to 3 show an example of a PDP to which the present invention is applied. FIG. 1 is a front view thereof, FIG. 2 is a sectional view taken along the line II—II in FIG. 1, and FIG. 3 is a sectional view taken along the line III—III in FIG. 1.

In FIGS. 1 to 3, a PDP 12 has a double structure with a front substrate 1 of glass and a rear substrate 2 of glass and has bus electrodes 10 at short-side opposite ends 1A and 1B of the front substrate 1, and address electrodes 20 at long-side opposite ends 2C and 2D of the rear substrate 2. The PDP 12 is shaped so that level differences in a direction of thickness of the PDP 12 between the front and rear substrates 1 and 2, that is, level differences 3 and 4 of about 3 mm each corresponding to the thickness of one of the substrates are disposed in the two kinds of electrode portions 10 and 20. Further, the PDP 12 is shaped so that protrusive portions 5 constituted by two gas filled tubes 21 and 22 are disposed on the rear surface side of the rear substrate 2. Incidentally, the region surrounded by the dotted line in the panel surface in FIG. 1 is equivalent to an effective display region 120 of the PDP 12.

Figure 4:
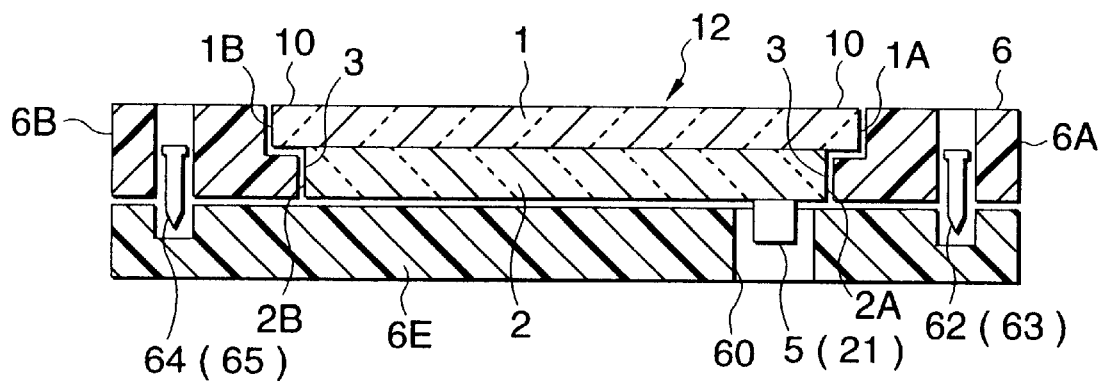
FIG. 4 shows a sectional view corresponding to FIG. 2, showing a state in which the plasma display panel is mounted on an attachment.
Figure 5:
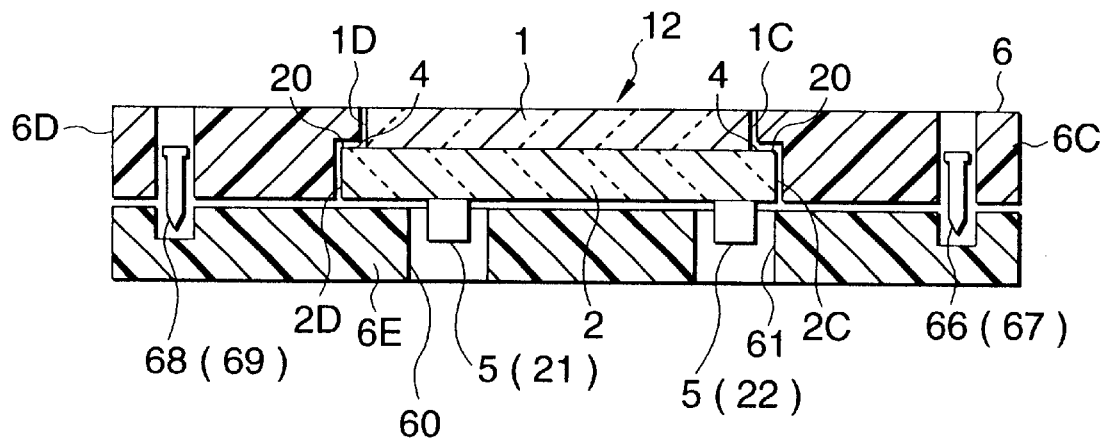
FIG. 5 shows a sectional view corresponding to FIG. 3, showing a state in which the plasma display panel is mounted on an attachment.

FIGS. 4 and 5 show a state in which the PDP configured as described above is mounted on an attachment used according to the present invention. In these drawings, FIG. 4 is a sectional view corresponding to FIG. 2, and FIG. 5 is a sectional view corresponding to FIG. 3.

In FIGS. 4 and 5, an attachment 6 is constituted by five parts, that is, opposite short side portions 6A and 6B facing the bus electrodes 10 of the PDP 12, opposite long side portions 6C and 6D facing the address electrodes 20 of the PDP 12, and a bottom portion 6E provided with holes 60 and 61 into which the protrusive portions 5 (gas filled tubes 21 and 22) of the PDP 12 are fitted. Hence, the attachment 6 is formed as a structure adapted to the shape of the PDP 12. The respective parts of attachment 6 can be separated individually, so that the attachment 6 is formed so as to be removable from to the PDP 12.

Such an attachment 6 can be molded with plastics (resin) such as a vinyl chloride resin, an acrylic resin, a polycarbonate resin, polyethylene, polypropylene, polyester, polyacetal, etc.; a thermoplastic elastomer such as polyurethane, etc.; a thermosetting resin such as an epoxy resin, etc.; a composite material such as an ultraviolet (light) curing resin, a foam, a fiber-reinforced plastic resin (FRP), etc.; an inorganic material such as ceramics, etc.; a metal; or any other molding material. A foam, or the like, may be preferably used as the molding material because it is more effective for prevention of cracking when the PDP is mounted or when a shield film is stuck. Further, a cushioning layer of such a foam may be partially provided in the attachment 6. Particularly, the cushioning layer may be preferably provided in the holes 60 and 61 into which the protrusive portions 5 are fitted.

The mounting of the PDP 12 on the attachment 6 is performed as follows. First, the protrusive portions 5 of the rear substrate 2 are fitted into the holes 60 and 61 so that the PDP 12 is mounted on the bottom portion 6E of the attachment 6. Then, the opposite short side portions 6A and 6B are positioned appropriately so as to face the bus electrodes 10 and fixedly attached to the bottom portion 6E by means of two pairs of screws 62 (63) and 64 (65) disposed side by side in directions of the short sides respectively. Similarly, the opposite long side portions 6C and 6D are positioned appropriately so as to face the address electrodes 20 and fixedly attached to the bottom portion 6E by means of two pairs of screws 66 (67) and 68 (69) disposed side by side in directions of the long sides respectively.

On this occasion, it is important to position and fix the opposite short side portions 6A and 6B and the opposite long side portions 6C and 6D so that the front substrate 1 and the opposite short side and long side portions 6A, 6B, 6C and 6D are arranged approximately in one plane, that is, the front surface side to be stuck to a transparent electromagnetic wave shield film is made approximately horizontal after the aforementioned mounting. It is also important that the opposite short side portions 6A and 6B are positioned and fixed so as to face short-side opposite ends 2A and 2B of the rear substrate 2 as well as the short-side opposite ends 1A and 1B of the front substrate 1 without any gap so that the level difference 3 in the direction of thickness between the two substrates 1 and 2 is eliminated apparently; and that the opposite long side portions 6C and 6D are positioned and fixed so as to face long-side opposite ends 1C and 1D of the front substrate 1 as well as the long-side opposite ends 2C and 2D of the rear substrate 2 without any gap so that the level difference 4 in the direction of thickness between the substrates 1 and 2 is eliminated apparently. Incidentally, a fitting groove may be formed in the bottom portion 6E, or the like, of the attachment 6 in order to facilitate the aforementioned mounting and demounting after the mounting.

Figure 6:
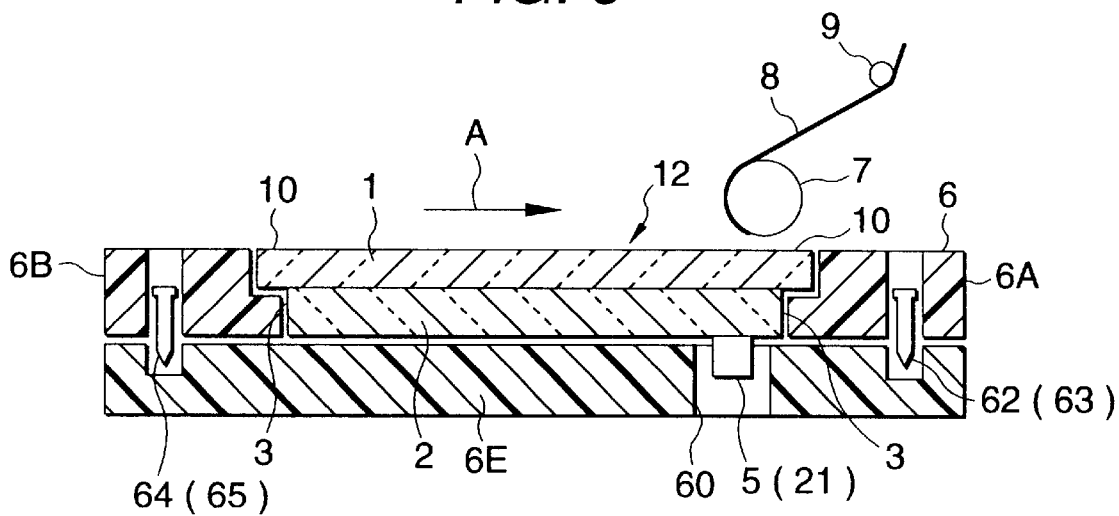
FIG. 6 shows a sectional view showing a state in which an electromagnetic wave shield film is stuck onto a front surface of the panel mounted on the attachment.

According to the present invention, as shown in FIG. 6, a sticking roll 7 constituted by a laminator roll, a rubber roll, or the like, is used for sticking a transparent electromagnetic wave shield film 8 directly to the front surface of the PDP 12 in a state in which the PDP 12 is mounted on the attachment 6 in the aforementioned manner. In this occasion, the shield film 8 may be stuck while the attachment 6 attached to the PDP 12 is moved in the direction of an arrow A or while the roll 7 is moved contrariwise. Preferably, the minimum pressure required for sticking the film 8 to the PDP 12 through an adhesive layer provided on the film 8 is exerted on the front surface uniformly.

Figure 7:
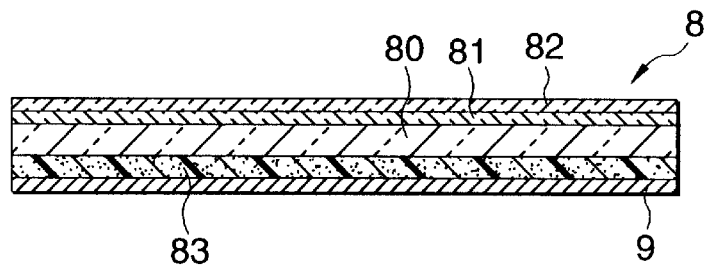
FIG. 7 shows a sectional view showing an example of configuration of the electromagnetic wave shield film.

As shown in FIG. 7, the transparent electromagnetic wave shield film 8 is constituted by: a transparent film base 80 made of a polyester resin such as polyethylene terephthalate or any one of other various resins and generally having a thickness in a range of from 5 to 2,000 $\mu$m; a transparent electromagnetic wave shield layer 81 provided on one surface of the transparent film base 80; and a transparent coating layer 82 provided on the transparent electromagnetic wave shield layer 81. The transparent coating layer 82 is constituted by a protective layer for providing surface hardness, mar-proofness and anti-contamination, and any kind of surface layer for providing anti-reflection, anti-glare, etc. The total thickness of the protective layer and the various surface layers is generally in a range of from 0.05 to 20 $\mu$m. Incidentally, the coating layer 82 may be replaced by a tacky film having the same anti-reflection and anti-glare as described above and having the same protecting function as described above so that the tacky film is stuck onto the electromagnetic wave shield layer 81. The shield film 8 further includes a transparent adhesive layer 83 provided on the other surface of the film base 80 for sticking the shield film 8 to the panel front surface through the adhesion layer 83, and a separator 9 such as release paper, or the like, provided on the adhesive layer 83 for facilitating protection and handling of the adhesive layer 83. The separator 9 is released when the shield film 8 is stuck to the panel front surface.

The thickness of the transparent electromagnetic wave shield layer 81 is generally in a range of from 50 to 500 nm approximately. A transparent electrically conductive multi-layered film constituted by a metal thin film and a high-refractive-index dielectric thin film produced through a dry process such as an evaporation method or a sputtering method may be used as an example of the transparent electromagnetic wave shield layer 81 having a surface resistance in a range of from 0.5 to 20 Ω/□. Alternatively, a mesh-like material obtained by patterning a metal film having a surface resistance of not higher than 1 Ω/□ may be used as another example of the transparent electromagnetic wave shield layer 81. Incidentally, near-infrared rays (800 to 1,000 nm) generated together with electromagnetic waves from the PDP can be cut off by the aforementioned transparent electrically conductive film. To improve the cutoff effect, a near-infrared absorbing layer made from a dye or pigment may be provided or a reflection type film made from a combination of R and S bodies of a high-molecular liquid crystal, or the like, may be provided. Further, a color correction film for correcting the color of an image displayed on the PDP, or the like, may be used.

The thickness of the transparent adhesive layer 83 is in a range of from 5 $\mu$m to several mm, preferably in a range of from 5 to 500 $\mu$m approximately. The transparent adhesive layer 83 is made from a polymer having wettability, cohesiveness and adhesiveness. Any kind of adhesive material can be used if the adhesive material is excellent in transparency (visible light transmissivity of not lower than 70%), weather resistance and heat resistance. A tackiness agent or any other material may be used as the adhesive material. Examples of such a transparent tackiness agent include an acrylic tackifier, a rubber tackifier, a polyester tackifier, etc. Of these, an acrylic tackifier is particularly preferred.

The acrylic tackifier contains an acrylic polymer as a main component, and any known additive added to the acrylic polymer suitably. The acrylic polymer is obtained by using (meth)acrylic alkyl ester with the polymer glass transition point (Tg) of not higher than −10° C. as a main monomer for giving mainly moderate wettability and flexibility to the tackifier and by polymerizing the main monomer with a functional-group-containing monomer and any other copolymerizable monomer by a polymerization method such as a solution polymerization method, an emulsion polymerization method, a bulk polymerization method (especially a polymerization method due to ultraviolet irradiation), a suspension polymerization method, or the like, using a suitable polymerization catalyst if necessary. The acrylic tackifier may be of a heat crosslinkable type, a light (ultraviolet, electron-beam) crosslinkable type, or the like.

Example of any other adhesive than the aforementioned adhesive include naturally-occurring polymers such as glue and starch; semisynthetic polymers such as acetic cellulose; and synthetic polymers such as polyvinyl acetate, polyvinyl chloride, an epoxy resin, an urethane resin, polychloroprene, acrylonitrile-butadiene copolymer, a melamine resin, an acrylic resin, ethylene-vinyl acetate copolymer, a polyester resin, a polyamide resin, etc. Further, these adhesives can be used as various curing types of adhesives such as an ordinary temperature curing type, a heat curing type, an ultraviolet curing type, an electron-beam curing type, a laser irradiation curing type, etc.

In the aforementioned configuration, a PDP 12 having long sides each about 1,000 mm long and short sides each about 600 mm long and being 6 mm thick in total of the substrates (each of front and rear substrates 1 and 2 being 3 mm thick) was used as a test example. A transparent electromagnetic wave shield film 8 was stuck to the panel front surface in a state in which the PDP 12 was mounted on an attachment 6 in the aforementioned manner. As a result, stress concentration into level differences 3 and 4 and protrusive portions 5 of the PDP 12 was not observed at the time of sticking as well as at the time of mounting. It was confirmed that the film 8 could be stuck to the panel front surface well without any obstacle such as damage of the PDP 12 in the aforementioned two kinds of portions.

Further, the PDP 12 covered with the film 8 in the aforementioned manner could be then separated from the attachment 6 easily so that the PDP 12 could be put into use as a product covered with the aforementioned film. It was also confirmed that the separated attachment 6 could be reused for sticking a film to another PDP.

Incidentally, in the aforementioned embodiment, the attachment 6 used is composed of the five parts, that is, the opposite short side portions 6A and 6B, the opposite long side portions 6C and 6D and the bottom portion 6E, which are molded separately. An attachment composed of the respective parts molded into one body or two bodies, however, may be used so long as the shape of the PDP 12 is not changed.

Further, any shape such as a shape having level differences in the direction of thickness and having gas filled tubes and other protrusive portions on the rear surface can be applied also to the PDP 12. Further, a shape having level differences in the direction of thickness but not having the aforementioned protrusive portions on the rear surface can be applied to the PDP 12. The same panel damage preventing effect as described above can be obtained when an attachment 6 adapted to the panel shape is used so that the aforementioned level differences and protrusive portions (only the level differences in the case where there is no protrusive portion) are eliminated apparently.

As described above, according to the present invention, an attachment adapted to the shape of a PDP is used for sticking an electromagnetic wave shield film directly onto a front surface of the PDP. Thus, the shield film is stuck onto the PDP in a state in which the PDP is mounted on the attachment to eliminate level differences and protrusive portions of the PDP apparently. Hence, stress can be prevented from being concentrated into the level difference portions and the protrusive portions, so that the shield film can be stuck onto the front surface well without any damage of the PDP. Moreover, characteristic of preventing broken parts of the panel from being scattered can be provided because the shield film is stuck directly onto the panel front surface.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A method of sticking a transparent electromagnetic wave shield film onto a front surface of a plasma display panel having a level difference in a direction of a thickness thereof, comprising steps of:

mounting the plasma display panel on an attachment adapted to an outer shape of the plasma display to thereby make an outer shape of the plasma display panel flat apparently; and sticking the film onto the front surface of the panel.

2. A method of sticking a transparent electromagnetic wave shield film onto a front surface of a plasma display panel, wherein the plasma display panel has a front substrate and a rear substrate laminated with each other, level differences being provided in a direction of thickness of the plasma display panel between the front substrate and the rear substrate, the level differences existing at four sides of the plasma display panel, and a protrusive portion being provided on a rear surface side of the rear substrate, the method comprising steps of:

preparing an attachment having two pairs of side portions and a bottom portion, each side portion having a shape adapted to the side of the plasma display panel having the level difference, and the bottom portion having a hole to which the protrusive portions are to be fitted;

mounting the plasma display panel on the attachment so that the protrusive portion is fitted into the hole of the bottom portion, the front substrate and side portions of the attachment are arranged approximately in one plane, and four sides of the plasma display panel each having the level difference face the side portions of the attachment without any gap to thereby make an outer shape of the plasma display panel flat apparently; and sticking the transparent electromagnetic wave shield film onto the front surface of the plasma display panel.

* * * * *